United States Patent
Pupalaikis

(10) Patent No.: US 6,542,914 B1
(45) Date of Patent: Apr. 1, 2003

(54) METHOD AND APPARATUS FOR INCREASING BANDWIDTH IN SAMPLED SYSTEMS

(75) Inventor: Peter J. Pupalaikis, Ramsey, NJ (US)

(73) Assignee: LeCroy Corporation, Chestnut Ridge, NY (US)

( * ) Notice: Subject to any disclaimer, the term of this patent is extended or adjusted under 35 U.S.C. 154(b) by 0 days.

(21) Appl. No.: 09/669,955

(22) Filed: Sep. 26, 2000

Related U.S. Application Data

(60) Provisional application No. 60/229,856, filed on Sep. 1, 2000.

(51) Int. Cl.⁷ ............................................... G06F 17/10
(52) U.S. Cl. ...................................................... 708/300
(58) Field of Search .......................... 708/300, 319–320; 327/552

(56) References Cited

U.S. PATENT DOCUMENTS

| | | |
|---|---|---|
| 5,283,483 A | 2/1994 | Laber et al. |
| 5,812,009 A | 9/1998 | Matsuura |
| 6,184,748 B1 | 2/2001 | Rao et al. |

*Primary Examiner*—Tan V. Mai
(74) *Attorney, Agent, or Firm*—Frommer Lawrence & Haug, LLP; William S. Frommer; Gordon Kessler

(57) ABSTRACT

Systems that sample a continuous analog time-domain signal. The invention is particularly applicable to systems whose analog components have a bandwidth limit below that desired or specified. The invention has been created to address particular problems in the design of digital sampling oscilloscopes (DSOs) that require more bandwidth than that which is easily achievable through traditionally analog techniques. A method and apparatus are provided in the form of a digital filter that is capable of surgically increasing the bandwidth of the system beyond the bandwidth achievable in an analog system. Furthermore, it is demonstrated that this system can perform this bandwidth increase without degradation in the time-domain performance of the system such as pulse or step response. In some cases, the time-domain performance is improved by flattening of the frequency response. Additionally, the system, while boosting the bandwidth, is capable of simultaneously removing noise and therefore producing a digitized signal of higher fidelity than that obtained without the filter in place.

18 Claims, 15 Drawing Sheets

METHOD AND APPARATUS FOR INCREASING BANDWIDTH IN SAMPLED SYSTEMS

CROSS-REFERENCE TO RELATED APPLICATIONS

This application claims the benefit of U.S. Provisional Application Ser. No. 60/229,856, filed Sep. 1, 2000, the entire contents of which are incorporated herein by reference.

BACKGROUND OF THE INVENTION

This invention related generally to the digital manipulation of a continuous time domain sample that is to be sampled in a digital oscilloscope, and more particularly to a digital filter that is capable of increasing the bandwidth of the sampling system beyond the bandwidth range achievable in an analog system.

The present state of the art deals with an attempt to increase bandwidth based upon the assumption that only analog manipulation techniques for modifying a signal to improve the bandwidth characteristics of an apparatus are possible. Other digital techniques are seen as manipulations of the signal that change the output result of the system. This results in a design methodology in which analog design engineers painstakingly design to the best of their ability analog circuitry that has high bandwidth, flat frequency response, good pulse response and is noise-free.

In many cases, these designs are extremely complicated, particularly in the design of a digital oscilloscope. Some reasons for this difficulty are:
1. There is a wide variation in the gain of the front-end, sometimes approaching 60 dB of dynamic range.
2. The signal is typically distributed to multiple Analog/Digital Converters (ADCs) in order to boost sample rate. This distribution is through buffers that tend to decrease the bandwidth of the system.
3. High bandwidth/high sample rate oscilloscopes typically use the absolute best of present electronics technology and are therefore being pushed to the limits of the hardware.
4. Bandwidth, noise, and pulse-response are a set of conflicting requirements that must be reconciled.

What makes things worse is that even upon observing and confirming the existence of problems with the bandwidth, flatness, pulse-response, and noise performance in the system, little can often be done to rectify the situation. This is because circuits designed to fix such problems are often not practically realizable.

Therefore, it would be beneficial to provide an improved Digital Signal Processing (DSP) method and apparatus capable of surgically dealing with lack of bandwidth, while offering some additional control of the pulse-response and flatness, and thereby decreasing the overall noise of the system as well.

OBJECTS OF THE INVENTION

It is therefore an object of the invention to provide an improved Digital Signal Processing (DSP) method and apparatus capable of surgically dealing with lack of bandwidth, while offering some additional control of the pulse-response and flatness.

Another object of the invention is to provide an improved Digital Signal Processing (DSP) method and apparatus capable of surgically dealing with lack of bandwidth, while offering some additional control of the pulse-response and flatness, and in which the overall noise of the system can be decreased.

A still further object of the invention is to provide an improved Digital Signal Processing (DSP) method and apparatus capable of surgically dealing with lack of bandwidth, while offering some additional control of the pulse-response and flatness by increasing the bandwidth in a very controlled manner.

Still other objects and advantages of the invention will in part be obvious and will in part be apparent from the specification and the drawings.

SUMMARY OF THE INVENTION

Generally speaking, in accordance with the invention, consider a system whose frequency response is shown in FIG. 2. As is apparent in FIG. 2, the response violates the limits on a specified 2 GHz frequency response by dropping below anindicated −3 dB point prior to 2 GHz. In other words, this unit is specified to be a 2 GHz unit, but the bandwidth provided does not provide an adequate response clearly out to the 2GHz limit. However, the system nearly makes it—the signal is only attenuated by around 4 dB out at 2 GHz.

What this system needs in order to meet its bandwidth specification is a slight boost in the frequencies in the range of 1.8 to 2 GHz. While such a boost might appear to be an easy solution, this is quite a difficult problem to solve in hardware. First, the frequencies of the hardware are quite high. Second, it is difficult to increase only the frequency response in this small band without ruining the performance of the unit.

Therefore, in accordance with the invention, a filter as specified in FIG. 3 is required. Such a filter is flat out to 1.8 GHz with 0 dB gain. At 1.8 GHz, the gain rises log-linearly to 4 dB. The filter is unspecified out to 3 GHz after which an attenuation of −5 dB is specified. The exact reasons for some of these specifications will be described below. These specifications are flexible in the filter design, and may be customized for any number of various design requirements.

After applying a filter with a response characteristic as shown in FIG. 3, the frequency response of the overall system would become that of FIG. 4. Notice that the frequency response up to 1.8 GHz is unaltered and that the system achieves 0 dB gain at exactly the bandwidth desired—that of 2 GHz. In other words, there is 3 dB margin at the specified bandwidth of the system.

Therefore, the invention focuses on providing a filter that meets the specifications shown in FIG. 3 and therefore surgically boosts the frequency response of the system with no other adverse affects.

In addition to increasing the bandwidth of the system to 2 GHz, the filter in accordance with the invention has an effect on the noise floor and roll-off. As is shown in FIG. 5, the noise floor of the boosted system is 5 dB below the un-boosted system noise floor because of the attenuation added outside the pass-band. Furthermore, the roll-off rate is approximately the same as in the un-boosted system.

The invention accordingly comprises the several steps and the relation of one or more of such steps with respect to each of the others, and the apparatus embodying features of construction, combination(s) of elements and arrangement of parts that are adapted to effect such steps, all as exemplified in the following detailed disclosure, and the scope of the invention will be indicated in the claims.

BRIEF DESCRIPTION OF DRAWINGS

For a more complete understanding of the invention, reference is made to the following description and accompanying drawings, in which.

DETAILED DESCRIPTION OF THE PREFERRED EMBODIMENT

Figure 3:
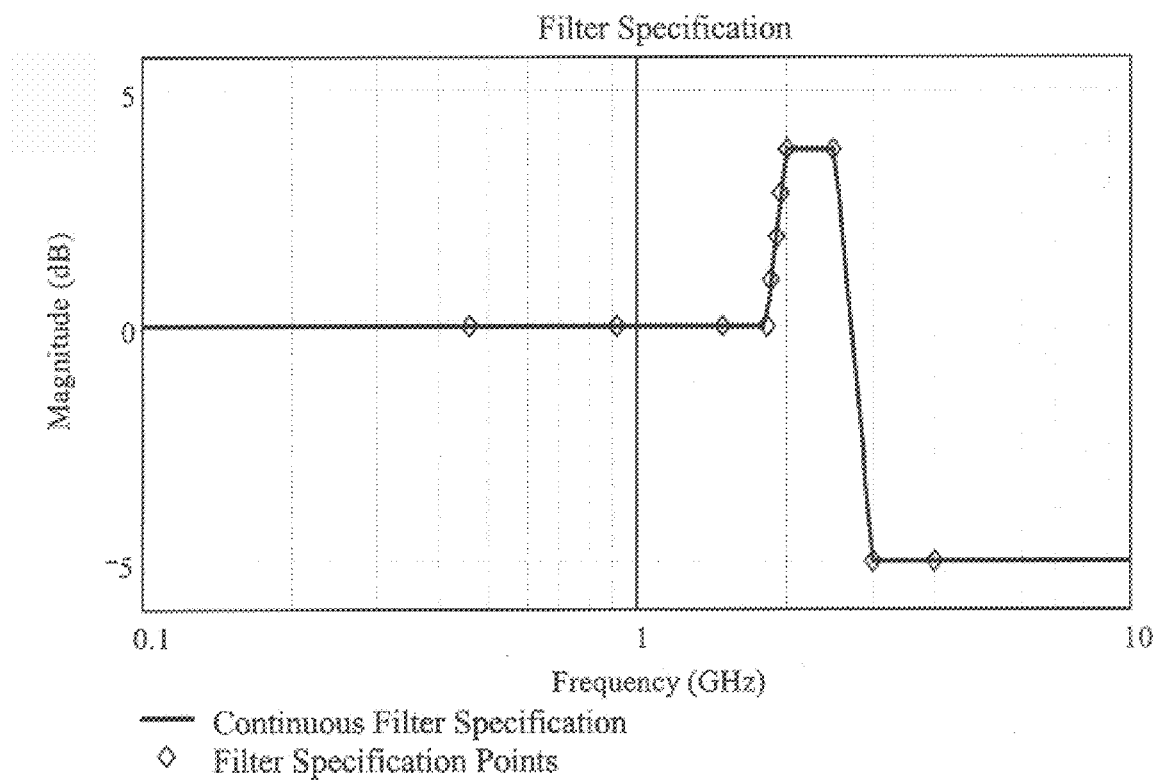
FIG. 3 contains a typical filter magnitude response specification in accordance with the invention used to boost the frequency response of the system in FIG. 2.
Figure 4:
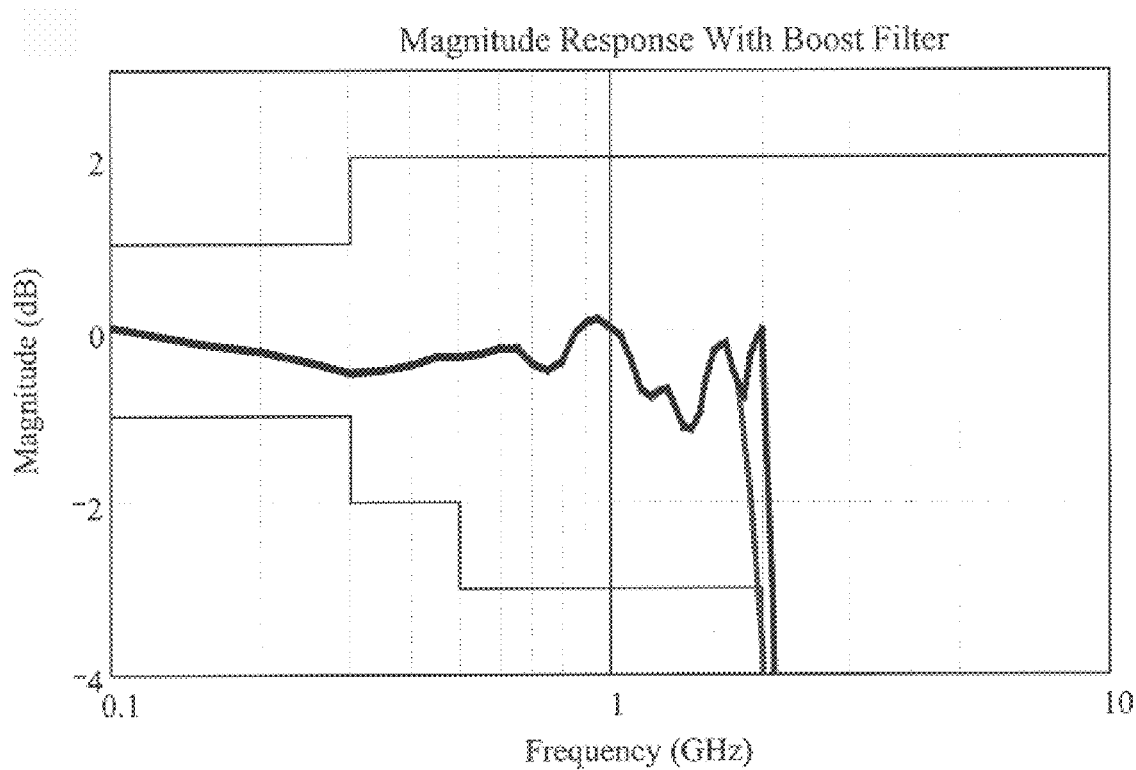
FIG. 4 shows the frequency response of the system in FIG. 2 with the ideally described boost filter in FIG. 3 applied in accordance with the invention.
Figure 5:
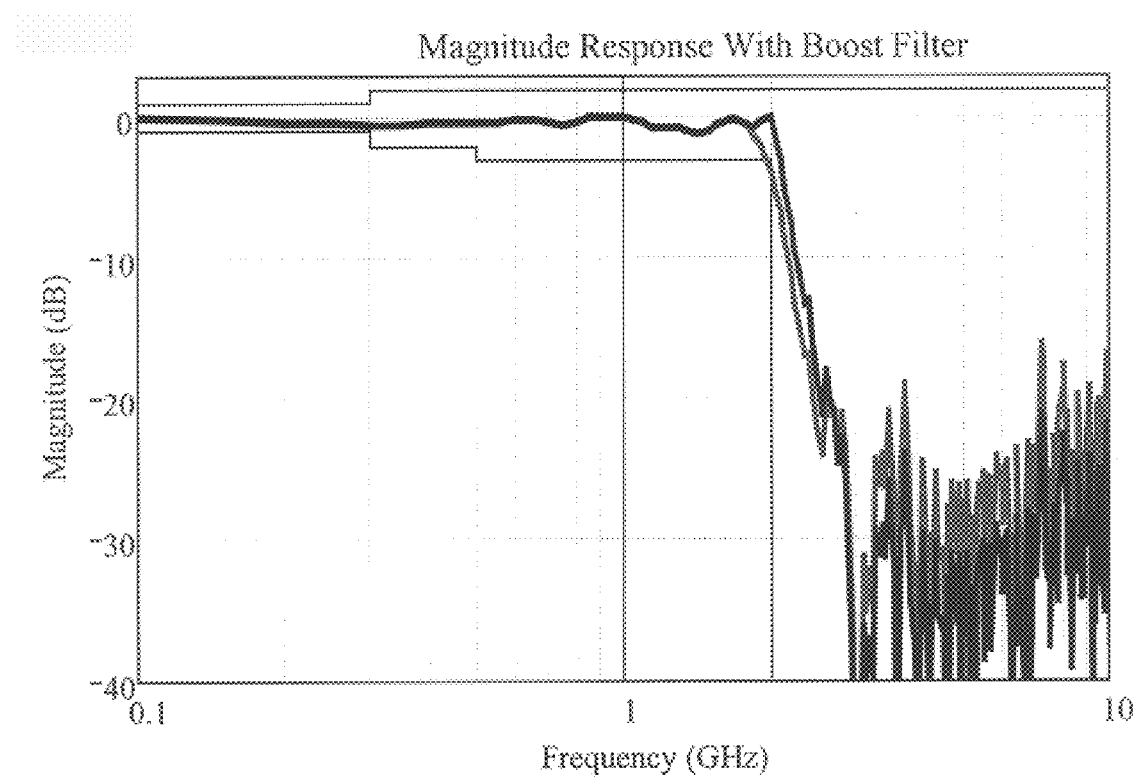
FIG. 5 shows the same response as in FIG. 4, but further highlights the stop-band noise reduction upon application of the filter in accordance with the invention.

A detailed description of the invention will now be provided, making reference to the figures. In accordance with the invention, given a desired ideal filter specification as shown in FIG. 3, a question arises as to a method for implementation of such an ideal specification in the real world. The preferred approach for such an implementation will now be described.

First, applicant introduces some explanation of notation regarding the filter specification:

TABLE 1

| Name | Abbreviation for | Description |
|---|---|---|
| $F_{sbs}$ | Stop-band start frequency-the first edge of the stop-band | The frequency at which the boost begins. |
| $F_{pbs}$ | Pass-band start frequency-the first edge of the pass-band | The frequency at which the boost levels off to the boost amount |
| $F_{pbe}$ | Pass-band end frequency-the last edge of the pass-band. | The frequency at which the boost begins to drop off. |
| $F_{sbe}$ | Stop-band end frequency-the last edge of the stop-band | The frequency at which the final attenuation is achieved. |
| $F_e$ | The final frequency specified | Usually the Nyquist rate at the lowest sample rate used with this filter. |
| B | The boost amount | The gain of the filter in the boost region. |
| A | The attenuation amount. | The attenuation of the filter in the attenuation region. |

Figure 1:
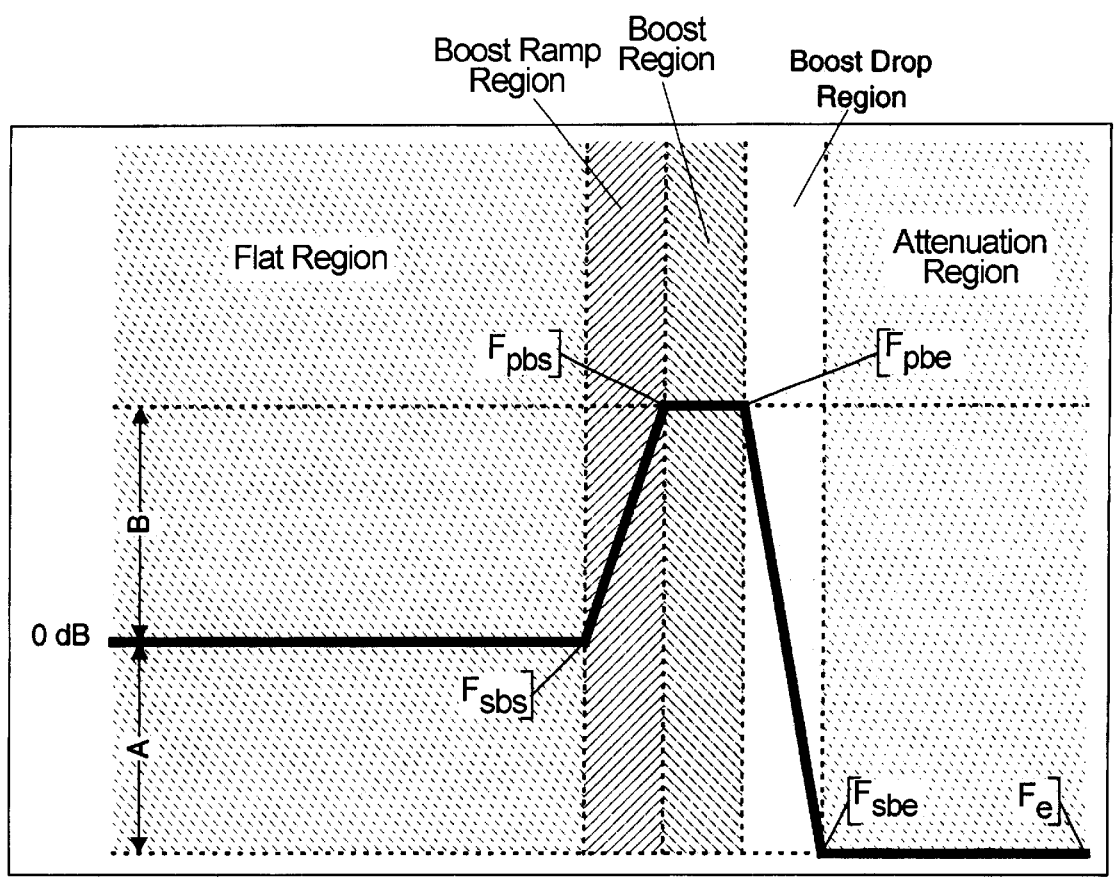
FIG. 1 is a graphical representation of a piece-wise linear frequency response description that serves as the filter specification in accordance with the invention.
Figure 2:
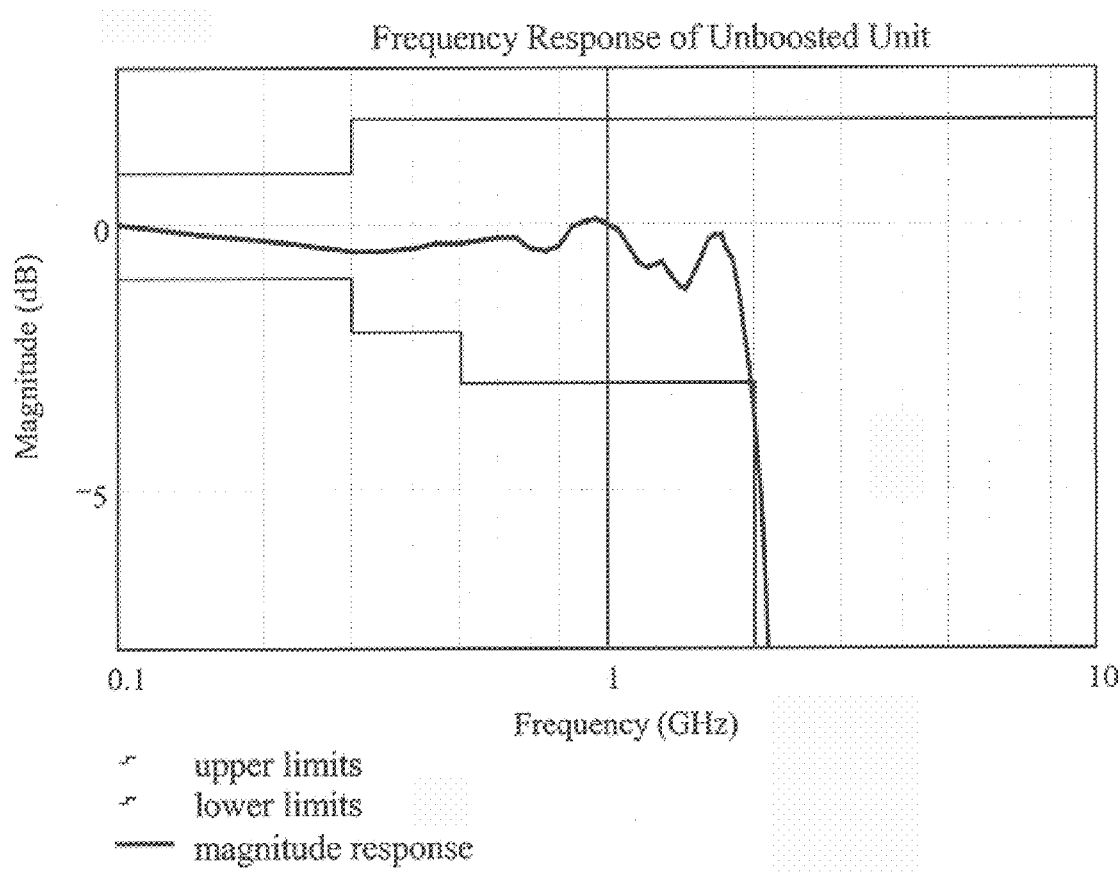
FIG. 2 shows the frequency response of a system prior to application of a boost filter constructed in accordance with the invention.

This notation is shown diagrammatically in FIG. 1.

In order to implement the ideal filter specification of FIG. 3 as an actual physical filter, some of the aspects of the specification should be noted:

1. The system is flat out to $F_{sbs}$.
2. There is a sharp corner at $F_{sbs}$,
3. There is a rather steep rise in the boost ramp region.
4. During the boost region, the boost is held.
5. The filter provides attenuation in the attenuation region.

In order to realize such a filter, it is natural to consider a filter consisting of a pair of complex conjugate poles, and zeros—a fourth order system. The poles and zeros are described in order of their distance from the origin in the s plane:

TABLE 2

| Pole or Zero | Frequency | Purpose |
|---|---|---|
| Zero 0 | Around $F_{sbs}$ | To begin the boost ramp |
| Pole 0 | Between $F_{pbs}$ and $F_{pbe}$ | To finish the boost ramp. |
| Pole 1 | Between $F_{pbs}$ and $F_{pbe}$ (but after Pole 0) | To sustain the boost and begin the boost drop. |
| Zero 1 | Around $F_{sbe}$. | To stabilize the boost drop and to begin the attenuation region. This zero is also instrumental in the design of the resulting digital filter. |

The s domain transfer function of such a filter is described using the following equation:

$$H(s) = \prod_{n=0}^{N-1} \frac{s^2 + \frac{\omega z_n}{Q z_n} \cdot s + (\omega z_n)^2}{s^2 + \frac{\omega p_n}{Q p_n} \cdot s + (\omega p_n)^2} \cdot \frac{(\omega p_n)^2}{(\omega z_n)^2} \qquad \text{Equation 1}$$

Where N is 2 for this case.

The filter in Equation 1 could be implemented in analog circuitry, but for the current purpose, it will be considered as an analog prototype filter that will be converted to a digital filter later in the design process.

The design of the analog prototype filter boils down to the determination of 8 values that will best meet the filter design criteria. These values are:

$$\omega z_0 = 2 \cdot \pi \cdot fz_0 \quad \omega p_0 = 2 \cdot \pi \cdot fp_0$$

$$\omega z_1 = 2 \cdot \pi \cdot fz_1 \quad \omega p_1 = 2 \cdot \pi \cdot fp_1$$

$$Q z_0 Q z_1 Q p_0 Q p_1 \qquad \text{Equation 2}$$

Considering the filter in Equation 1, it is clear that the magnitude response of such a system is described as follows:

$$M(f) = \sum_{n=0}^{N-1} 20 \cdot \qquad \text{Equation 3}$$

$$\log \left\| \frac{(j \cdot 2 \cdot \pi \cdot f)^2 + \frac{2 \cdot \pi \cdot fz_n}{Q z_n} \cdot (j \cdot 2 \cdot \pi \cdot f) + (2 \cdot \pi \cdot fz_n)^2}{(j \cdot 2 \cdot \pi \cdot f)^2 + \frac{2 \cdot \pi \cdot fp_n}{Q p_n} \cdot (j \cdot 2 \cdot \pi \cdot f) + (2 \cdot \pi \cdot fp_n)^2} \cdot \frac{(2 \cdot \pi \cdot fp_n)^2}{(2 \cdot \pi \cdot fz_n)^2} \right\|$$

The solution of the variables in Equation 2 is performed by finding these set of variables in which the magnitude response given by Equation 3 best matches the filter design criteria in the least-squares sense. Unfortunately, Equation 3 represents a non-linear function of these variables therefore requiring methods of non-linear fitting. The method used for this invention is the Levenberg-Marquardt algorithm. In order to use this algorithm, several items must be provided. First, the partial derivatives of must be provided with respect to each of the variables being solved for:

$$\frac{\partial}{\partial fp_n} M(f) = \qquad \text{Equation 4}$$

$$\frac{20}{\ln(10)} \cdot \frac{[2 \cdot (Q p_n)^2 \cdot f^4 - 2 \cdot (Q p_n)^2 \cdot (fp_n)^2 \cdot f^2 + (fp_n)^2 \cdot f^2]}{[fp_n \cdot (Q p_n)^2 \cdot f^4 - 2 \cdot (Q p_n)^2 \cdot (fp_n)^3 \cdot f^2 + (Q p_n)^2 \cdot (fp_n)^5 + (fp_n)^3 \cdot f^2]}$$

$$\frac{\partial}{\partial Q p_n} M(f) = \frac{20}{\ln(10)} \cdot \frac{(fp_n)^2 \cdot f^2}{[(Q p_n)^3 \cdot f^4 - 2 \cdot (Q p_n)^3 \cdot (fp_n)^2 \cdot f^2 + (Q p_n)^3 \cdot (fp_n)^4 + Q p_n \cdot (fp_n)^2 \cdot f^2]} \qquad \text{Equation 5}$$

$$\frac{\partial}{\partial fz_n} M(f) = \qquad \text{Equation 6}$$

$$\frac{-20}{\ln(10)} \cdot \frac{[f^2 \cdot (fz_n)^2 - 2 \cdot f^2 \cdot (Q z_n)^2 \cdot (fz_n)^2 + 2 \cdot f^4 \cdot (Q z_n)^2]}{[fz_n \cdot (Q z_n)^2 \cdot f^4 + (fz_n)^3 \cdot f^2 - 2 \cdot f^2 \cdot (Q z_n)^2 \cdot (fz_n)^3 + (Q z_n)^2 \cdot (fz_n)^5]}$$

$$\frac{\partial}{\partial Q z_n} M(f) = \frac{-20}{\ln(10)} \cdot \frac{(fz_n)^2 \cdot f^2}{[f^4 \cdot (Q z_n)^3 + Q z_n \cdot f^2 \cdot (fz_n)^2 - 2 \cdot f^2 \cdot (Q z_n)^3 \cdot (fz_n)^2 + (Q z_n)^3 \cdot (fz_n)^4]} \qquad \text{Equation 7}$$

Next, the vectors containing the frequencies and the responses desired must be created:

$$f_{spec} := \begin{bmatrix} 0 \\ \frac{F_{sbs}}{4} \\ \frac{F_{sbs}}{2} \\ F_{hs} \\ F_{sbs} \\ F_{sbs} + \frac{1}{4} \cdot (F_{pbs} - F_{sbs}) \\ F_{sbs} + \frac{1}{2} \cdot (F_{pbs} - F_{sbs}) \\ F_{sbs} + \frac{3}{4} \cdot (F_{pbs} - F_{sbs}) \\ F_{pbs} \\ F_{pbe} \\ F_{sbe} \\ 4 \end{bmatrix} \qquad \text{Equation 8}$$

Note the introduction of a frequency $F_{hs}$. It is useful to control this frequency in the specification, as can be seen later. For now, assume it is three quarters of $F_{sbs}$.

The specified frequencies given are calculated specifically to provide enough points in the flat region to ensure flatness, enough points in the boost ramp region to provide a controlled boost. In short, these are the most important points in the design and therefore there are more points specified in this region.

Next, the response vector is calculated. The response vector contains the desired response at each of these frequency points. If controlling of flatness in the system is desired, frequencies and responses may be contrived which are the negative of the actual, unboosted response. I have chosen to use the specification as shown in FIG. 3 which can be described programmatically as:

$$H_{des}(f) := \qquad \text{Equation 9}$$

$$\begin{cases} \text{return } 0 \text{ if } f < F_{sbs} \\ \left[\text{return } \left(\frac{\log\left(\frac{f}{F_{sbs}}\right)}{\log\left(\frac{F_{pbs}}{sbs}\right)}\right) \cdot B\right] \text{ if } F_{pbs} > f \geq F_{sbs} \\ \text{return } B \text{ if } F_{pbe} \geq f \geq F_{pbs} \\ \left[\text{return } B - \left(\frac{\log\left(\frac{f}{F_{pbe}}\right)}{\log\left(\frac{F_{pbe}}{F_{sbe}}\right)}\right) \cdot -(B - A)\right] \text{ if } F_{sbe} > f \geq F_{pbe} \\ \text{return } A \text{ if } f \geq F_{sbe} \\ -100 \end{cases}$$

The response vector is generated as:

$$M_{spec} = M_{des}(f_{spec}) \qquad \text{Equation 10}$$

Finally, the Levenberg-Marquardt algorithm requires a vector of guesses at the values of the variables being solved for.

Since Table 2 outlined the approximate pole and zero locations, it seems reasonable to use these approximations in the fitting algorithm. It also seems reasonable to select Q values that are somewhat high because of the sharp changes in the filter criteria. Therefore, the guess vector becomes:

$$g = \begin{pmatrix} F_{pbs} \\ 5 \\ F_{sbs} \\ 5 \\ F_{pbe} \\ 5 \\ F_{sbe} \\ 5 \end{pmatrix} \quad \text{Equation 11}$$

Note the order of the values in this vector. This vector supplies the initial guesses at the variables, and is altered on each iteration of the Levenberg-Marquardt algorithm until convergence is achieved. Therefore, subsequently, the values of this guess vector are assumed to correspond to the following variables being solved for:

$$g_0 = fp_0 \quad g_4 = fp_1 \quad \text{Equation 12}$$
$$g_1 = Qp_0 \quad g_5 = Qp_1$$
$$g_2 = fz_0 \quad g_6 = fz_1$$
$$g_3 = Qz_0 \quad g_7 = Qz_1$$

Upon determining these guesses, all that is necessary is to run multiple iterations of the Levenberg-Marquardt algorithm. Typically, iteration is halted once the mean-squared error has become small enough. An iteration of the Levenberg-Marquardt algorithm is shown here:

$$g_i = \left|\begin{array}{l} \text{for } k\epsilon 0 \ldots K-1 \\ \quad R_k \leftarrow M(f_{spec_k}, g) - M_{spec_k} \\ \quad W_{k,k} \leftarrow 1 \\ \quad J_{k,0} \leftarrow \dfrac{\partial}{\partial fp_0} M(f_{spec_k}, g) \\ \quad J_{k,1} \leftarrow \dfrac{\partial}{\partial Qp_0} M(f_{spec_k}, g) \\ \quad J_{k,2} \leftarrow \dfrac{\partial}{\partial fz_0} M(f_{spec_k}, g) \\ \quad J_{k,3} \leftarrow \dfrac{\partial}{\partial Qz_0} \\ \quad J_{k,4} \leftarrow \dfrac{\partial}{\partial fp_1} M(f_{spec_k}, g) \\ \quad J_{k,5} \leftarrow \dfrac{\partial}{\partial Qp_1} M(f_{spec_k}, g) \\ \quad J_{k,6} \leftarrow \dfrac{\partial}{\partial fz_1} M(f_{spec_k}, g) \\ \quad J_{k,7} \leftarrow \dfrac{\partial}{\partial Qz_1} M(f_{spec_k}, g) \\ H \leftarrow J^T \cdot W \cdot J \\ \text{for } v\epsilon 0 \ldots V-1 \\ \quad D_{v,v} \leftarrow H_{v,v} \\ ms\varepsilon_i \leftarrow \sum_{k=0}^{SP-1} (R_k)^2 \\ \Delta P \leftarrow (H + \lambda \cdot D)^{-1} \cdot \\ J^T \cdot W \cdot R \\ g \leftarrow g - \Delta P \\ ms\varepsilon_f \leftarrow \sum_{k=0}^{SP-1} (M(f_{spec_k}, g) - H_{spec_k})^2 \\ \lambda \leftarrow \lambda \cdot 10 \text{ if } ms\varepsilon_f > ms\varepsilon_i \\ \lambda \leftarrow \lambda \cdot 10 \text{ if } ms\varepsilon_f > ms\varepsilon_i \\ g \end{array}\right.$$

Equation 13 for each point specified
Generate a residual
Generate the weights matrix
Fill in a row of the Jacobian matrix with the partial derivatives with respect to each variable Generate the approximate Hessian matrix, and a diagonal matrix whose elements are those on diagonal.

Calculate the mean-squared error

Calculate the delta to the variables being solved for and apply the delta

Calculate the new mean-squared error

If the new mean squared error improved, favor Newton-Gauss convergence, otherwise favor steepest decent convergence For the filter specified in FIG. 3, the result of successive iterations of this algorithm result in the following filter values:

$$fp = \begin{pmatrix} 1{,}935 \\ 2{,}515 \end{pmatrix} \quad Qp = \begin{pmatrix} 4{,}767 \\ 321 \end{pmatrix}$$

$$fz = \begin{pmatrix} 185 \\ 3{,}049 \end{pmatrix} \quad Qz = \begin{pmatrix} 5{,}557 \\ 359 \end{pmatrix}$$

The poles and zero locations of this filter are the roots of the four equations of the following form:

$$s^2 + \frac{2 \cdot \pi \cdot f}{Q} \cdot s + (2 \cdot \pi \cdot f)^2 \qquad \text{Equation 14}$$

Figure 6:
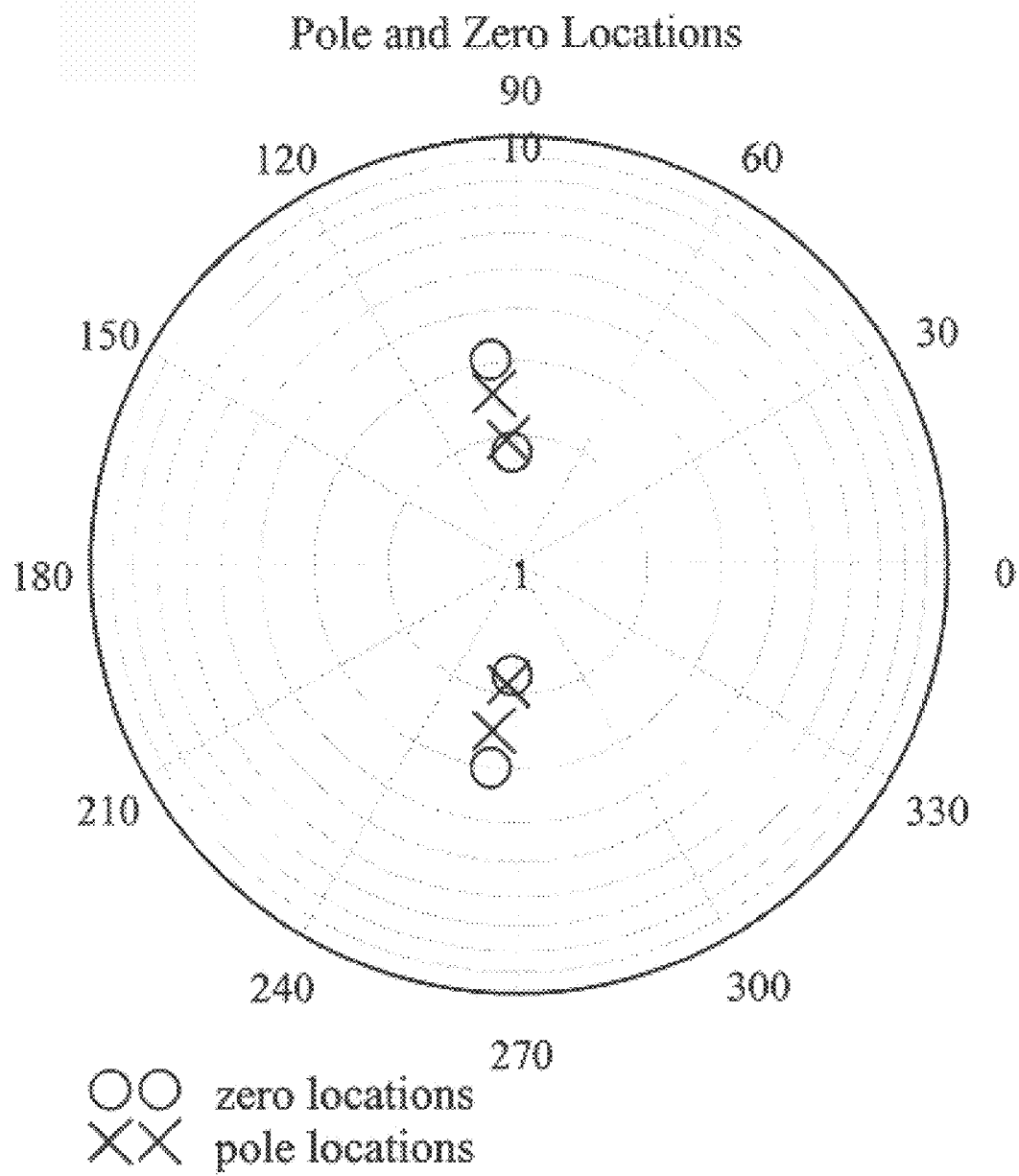
FIG. 6 shows the pole and zero locations of an analog filter in accordance with the invention that meets the specifications in FIG. 3.

This form is shown in FIG. 6. Note that the magnitudes are shown as frequency, not ω which is sometimes customary.

Figure 7:
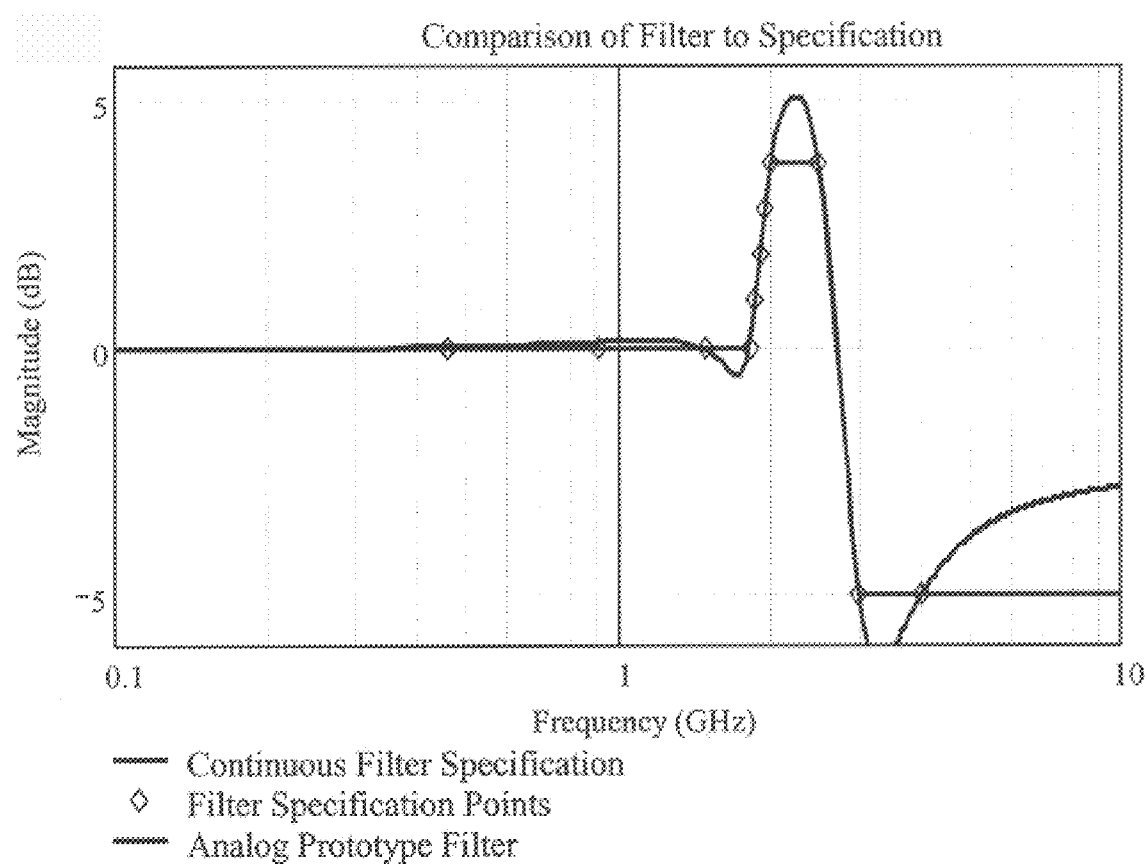
FIG. 7 shows a comparison of the performance of the analog filter of FIG. 6 to the ideally specified filter in accordance with the invention.

The response of this filter can be compared to the filter specifications and is shown in FIG. 7. It can be seen that the analog prototype filter matches the specifications quite well.

Some observations regarding FIG. 7 are discussed below. As implied previously, this filter is a valid analog filter design and could be implemented using actual electronic components such as resistors, capacitors and inductors. For the purpose of this invention, this filter will be implemented as a digital filter with the design so far providing an analog prototype filter.

The method chosen here for conversion to a digital filter is the bilinear transformation. In order to make this transformation, the pole and zero locations must be pre-warped to account for the nonlinear frequency mapping enforced by the bilinear transform:

$$\alpha' = -2 \cdot f_s \cdot \frac{\left(e^{\frac{-\alpha}{f_s}} - 1\right)}{\left(e^{\frac{-\alpha}{f_s}} + 1\right)} \qquad \text{Equation 15}$$

Where $f_s$ is the sampling rate of the system (in GS/s, in this case) and α is the pole or zero being pre-warped. Note that at this point in the filter design, the sampling rate of the system must be known. In the implementation of this invention in a digital oscilloscope where the sample rate is variable, the design steps starting with the application of Equation 15 are performed dynamically within the oscilloscope itself as the sample rate is changed.

After the pre-warping, the new f and Q values are calculated. These are calculated as follows:

$$f' = \frac{|\alpha'|}{2 \cdot \pi} \qquad \text{Equation 16}$$

$$Q' = \frac{1}{2 \cdot \cos(\pi - arg(\alpha'))}$$

Note that only one of the complex conjugate pairs of the two sets of poles and zeros need be considered in.

In order to convert this prototype into a digital filter, the transfer function described in Equation 1 must be factored in s and placed in the following form:

$$H(s) = \frac{\sum_{n=0}^{2 \cdot N} a_n \cdot s^n}{\sum_{n=0}^{2 \cdot N} b_n \cdot s^n} \qquad \text{Equation 17}$$

Once this is done, the filter coefficients are calculated as:

$$\omega z_0 = 2 \cdot \pi \cdot fz'_0 \quad \omega z_1 = 2 \cdot \pi \cdot fz'_1 \qquad \text{Equation 18}$$

$$D_{num} = (\omega z_0)^2 \cdot (\omega z_1)^2$$

$$a_4 = \frac{1}{D_{num}}$$

$$a_3 = \left(\frac{\omega z_0}{Qz'_0} + \frac{\omega z_1}{Qz'_1}\right) \cdot \frac{1}{D_{num}}$$

$$a_2 = \left[(\omega z_0)^2 + \frac{\omega z_0 \cdot \omega z_1}{Qz'_0 \cdot Qz'_1} + (\omega z_1)^2\right] \cdot \frac{1}{D_{num}}$$

$$a_1 = \left[\frac{(\omega z_0)^2 \cdot \omega z_1}{Qz'_1} + \frac{(\omega z_1)^2 \cdot \omega z_0}{Qz'_0}\right] \cdot \frac{1}{D_{num}}$$

$$a_0 = 1$$

$$\omega p_0 = 2 \cdot \pi \cdot fp'_0 \quad \omega p_1 = 2 \cdot \pi \cdot fp'_1$$

$$D_{den} = (\omega p_0)^2 \cdot (\omega p_1)^2$$

$$b_4 = \frac{1}{D_{den}}$$

$$b_3 = \left(\frac{\omega p_0}{Qp'_0} + \frac{\omega p_1}{\omega p'_1}\right) \cdot \frac{1}{D_{den}}$$

$$b_2 = \left[(\omega p_0)^2 + \frac{\omega p_0 \cdot \omega p_1}{Qp'_0 \cdot Qp'_1} + (\omega p_1)^2\right] \cdot \frac{1}{D_{den}}$$

$$b_1 = \left[\frac{(\omega p_0)^2 \cdot \omega p_1}{Qp'_1} + \frac{(\omega p_1)^2 \cdot \omega p_0}{Qp'_0}\right] \cdot \frac{1}{D_{den}}$$

$$b_0 = 1$$

Finally, the analog filter coefficients are converted to digital filter coefficients using the bilinear coefficient formulae:

$$BF(i, n, N) := \qquad \text{Equation 19}$$

$$2^i \cdot \sum_{k=\max(n-N+i,0)}^{\min(i,n)} \frac{i! \cdot N - i!}{k! \cdot (i-k)! \cdot (n-k)! \cdot (N-i-n+k)!} \cdot (-1)^k$$

$$A_n = \sum_{i=0}^{2 \cdot N} a_i \cdot f_s^i \cdot BF(i, n, N)$$

$$B_n = \sum_{i=0}^{2 \cdot N} b_i \cdot f_s^i \cdot BF(i, n, N)$$

$$A := \frac{A}{B_0} \quad B := \frac{B}{B_0}$$

For a sample rate of 50 GS/s, the filter coefficients for the design specified are calculated as:

$$A = \begin{pmatrix} 0.746 \\ -2.737 \\ 3.892 \\ -2.539 \\ 0.643 \end{pmatrix} \quad B = \begin{pmatrix} 1 \\ -3.705 \\ 5.286 \\ -3.437 \\ 0.861 \end{pmatrix}$$

The final Z domain transfer function is of the form:

$$H(z) = \frac{\sum_{n=0}^{2 \cdot N} A_n \cdot z^{-n}}{\sum_{n=0}^{2 \cdot N} B_n \cdot z^{-n}} \quad \text{Equation 20}$$

Figure 8:
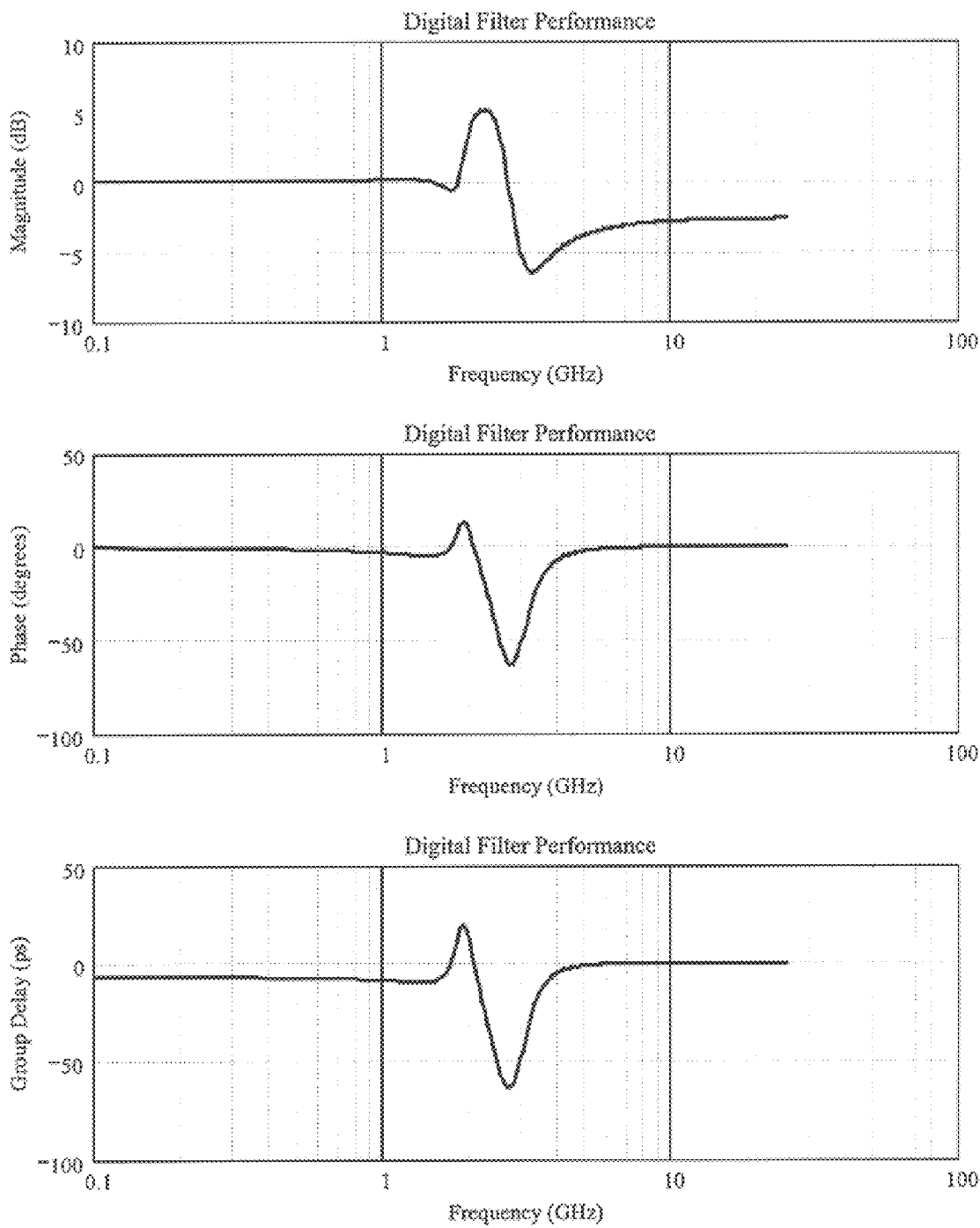
FIG. 8 shows the performance characteristics of the resulting digital filter in accordance with the invention calculated using the analog filter poles and zeros in FIG. 6 as the analog filter specification.
Figure 9:
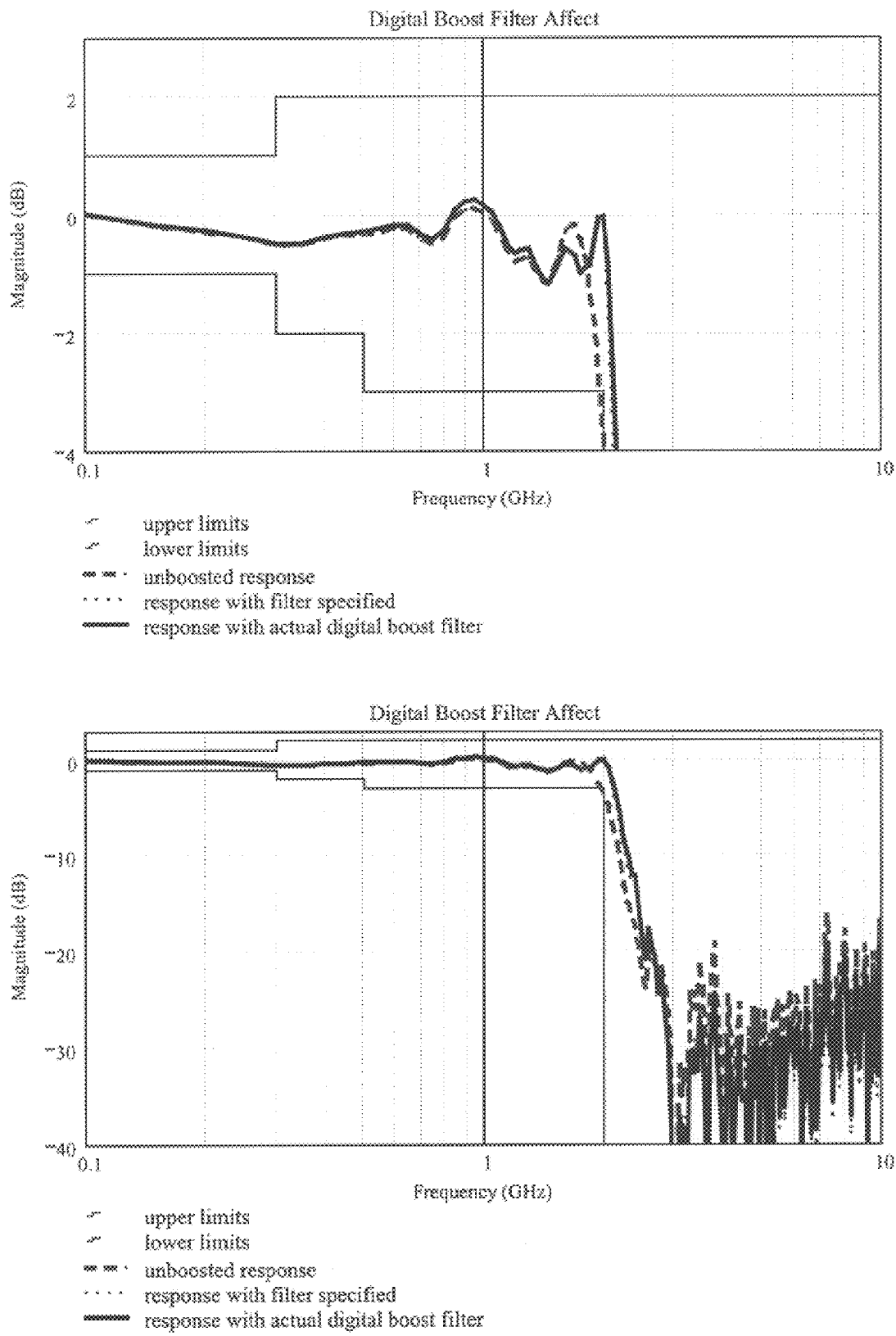
FIG. 9 depicts a view similar to that of FIG. 4 and FIG. 5, except that the actual digital filter in accordance with the invention is applied to the system.

The affect of this filter on the overall magnitude response of the system is shown in FIG. 9. The digital filter performance is shown in FIG. 8. The best form of the difference equation which implements the filter is found to be:

$$y_k = A_0 \cdot x_k + \sum_{n=1}^{2 \cdot N} (A_n \cdot x_{k-1} - B_n \cdot y_{k-1}) \quad \text{Equation 21}$$

Where $x_k$ is the data sampled by the digitizing system and $y_k$ is the data at the output of the boost filter. The filter implementation is Infinite Impulse Response (IIR).

Practical Considerations 1.1 Noise Boost in the Pass-band

The application of this filter will boost, along with the signal, any noise contained in the boost ramp region and boost region. Therefore, before application of this filter, the unboosted system noise profile must be analyzed to determine the applicability of this filter. It is important to note that while boosting noise in these regions, the filter also attenuates noise beyond the pass-band of the system. This may or may not result in an overall noise performance improvement, depending on the noise sources.

Figure 12:
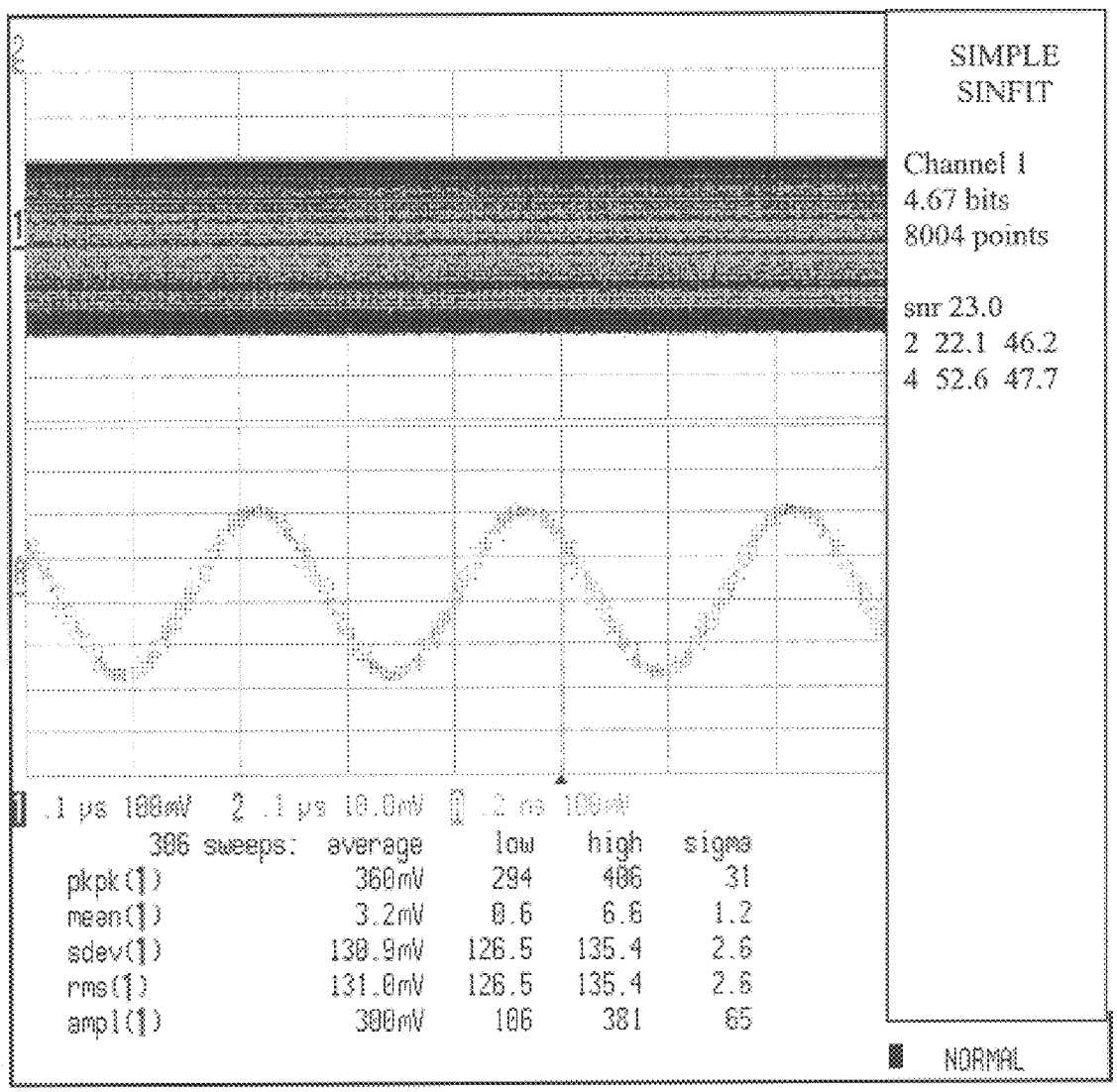
FIG. 12 shows an effective bits calculation of the digital sampling oscilloscope of FIG. 10 without a boost filter of the invention applied.
Figure 13:
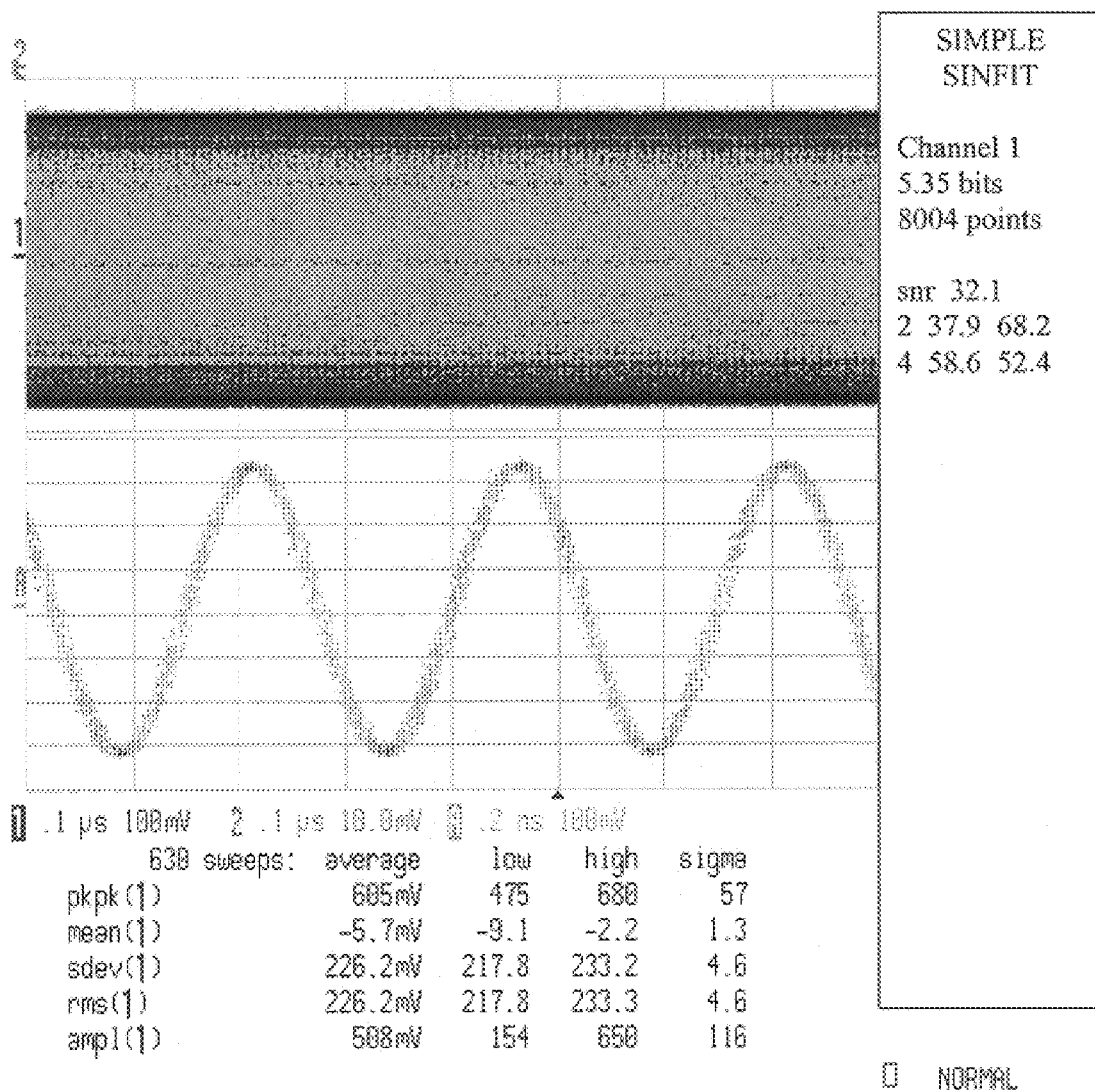
FIG. 13 shows an effective bits calculation of the digital sampling oscilloscope of FIG. 10 with a boost filter of the invention applied, highlighting the noise reduction features of the invention.

In order to check this, a 260.6 mV rms sine wave at 2 GHz is applied using an RF signal generator and a sine-fit is applied. The sinefit tells the Signal to Noise Ratio (SNR) and also the Effective Number of Bits (ENOB). FIG. 12 and FIG. 13 show a comparison with and without the boost filter in place. FIG. 12, without the boost filter, shows an rms value of 131 mV, an attenuation of approximately 6 dB, and ENOB and SNR of 4.67 and 23, respectively. FIG. 13, with the boost filter, shows an rms value of 226.2 mV, an attenuation of 1.23 dB, and an ENOB and SNR of 5.35 and 32.1, respectively. This means that for this application, the boost filter resulted in an increase in the effective bits by over 0.6 while making the bandwidth specification. In other words, the bandwidth was boosted while simultaneously improving the noise performance of the unit.

1.2 Nyquist Limitation and Stabilizing Zero Placement

As with all digital filters, there is the limitation of sample rate on the system. Because of Nyquist's criteria, a digital filter can perform like an analog system up to ½ the sample rate of the system, after which the filter response repeats over and over. In other words, frequencies above ½ the sample rate appear as aliases at frequencies under ½ the sample rate. Even worse, the conversion of the analog prototype filter has big problems using the bilinear transformation if any pole or zero locations are above the Nyquist rate.

$F_c$ in the filter specification must appear at or below the Nyquist rate. The determination of the location of the stabilizing zero is performed mostly through the specification of the attenuation at $F_{sbe}$. The fact that $F_{sbe}$ in this design has attenuation A specified constrains the stabilizing zero to appear at a frequency between $F_{sbe}$ and $F_e$. While this causes the objectionable decrease in attenuation in the attenuation region, it does help in the realization of the digital filter. The attenuation of $F_{sbe}$ be decreased, which will move the stabilizing zero higher in frequency, but the design must keep this zero below the Nyquist rate of the system, otherwise the filter design will fail.

1.3 Filter Startup

Any system employing memory will take some time to stabilize after the signal appears for the first time. This is not generally a problem, and most designs handle this by waiting some time for signals to stabilize. In the case of a digital oscilloscope, this is accomplished through pre-trigger hold-off. When the acquisition system is armed and acquiring, the trigger is held off until enough time has passed for everything to stabilize. In the case of a digital oscilloscope utilizing the present invention, there is an additional problem. There will be some stabilization time associated with the filter, and the system does not get to see the waveform until the point in time that the waveform has been acquired and is being read-out of the acquisition system memory. This means that additional samples must be acquired at the beginning of the waveform so that when the filter is applied, the system will have stabilized prior to the point at which the waveform comes on-screen. The points prior to the left edge of the oscilloscope screen where the filter is stabilizing are simply discarded. Since the filter-taps are loaded with zeros (or more commonly, the first point in the input waveform), the first point entering the filter looks like a step. Therefore, the startup time can be estimated by examining the impulse response of the filter.

Figure 14:
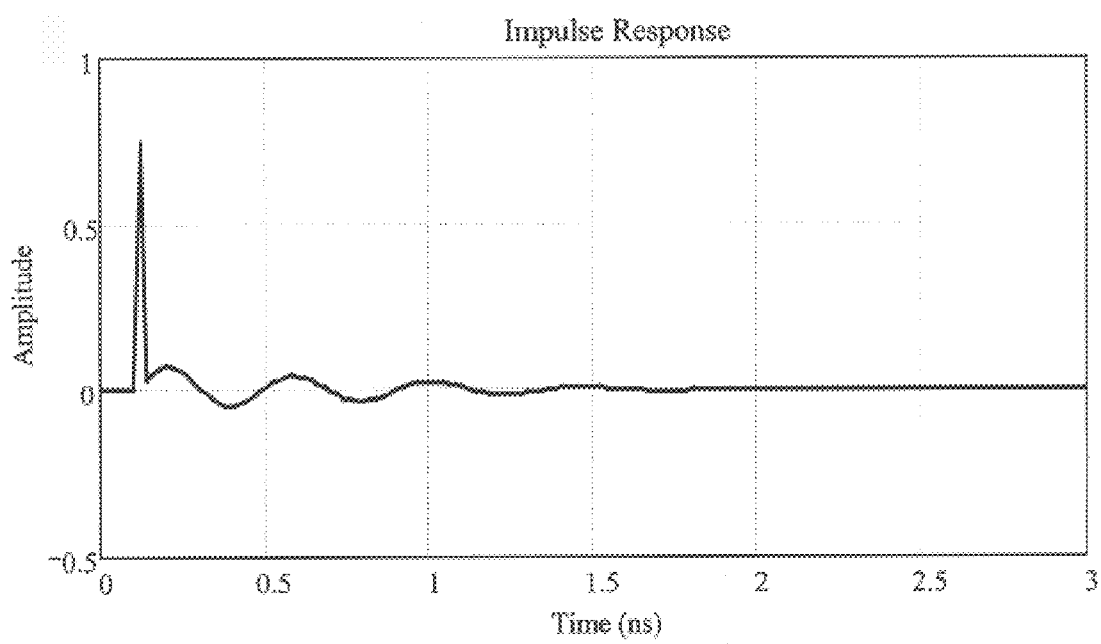
FIG. 14 shows a digital filter impulse response.

The impulse response for the design example provided is shown in FIG. 14. This response was calculated using Equation 21. It is useful to note that this sampled impulse response could be used as the coefficients of a Finite Impulse Response (FIR) filter design.

Figure 15:
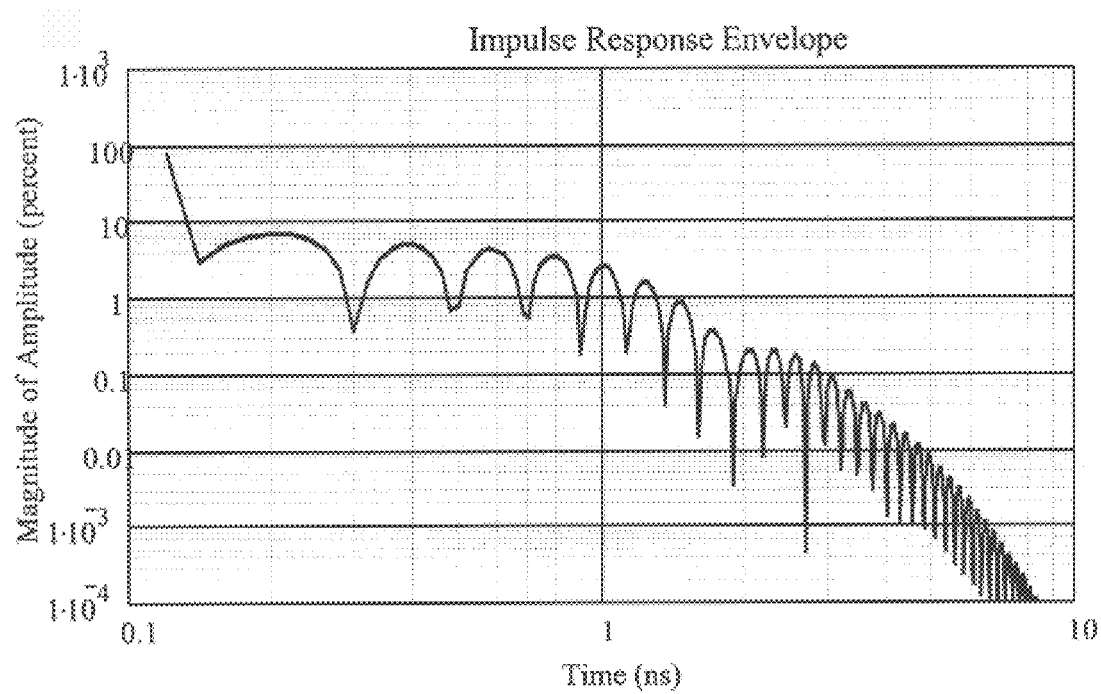
FIG. 15 shows the same impulse response of FIG. 14 plotted magnitude log-log used to calculate filter settling time.

In order to determine the precise startup time required, FIG. 15 is provided which shows the magnitude of the amplitude with respect to time plotted log-log. From this plot you can see that a filter startup time allowance of 3 ns allows the system to stabilize to within 0.1% of its final value.

1.4 The Importance of the Stabilizing Zero in the Digital Filter Design.

The final zero in the system, the stabilizing zero, has the effect of leveling off the attenuation of the system. Some might consider this objectionable, preferring the attenuation to continue, and thus gaining the maximum noise attenuation. This is possible, however some problems arise in the removal of this zero.

First, Equation 15, which provides the pre-warping equation, works only with an equal number of poles and zeros in the system. This is a huge benefit, because Equation 15 provides a digital filter whose frequency domain performance matches almost identically the analog filter performance, even when the frequencies of interest are up near the Nyquist rate of the system. Therefore, removal of the stabilizing zero will cause difficulties in matching the digital filter to the analog prototype filter.

Second, keep in mind that digital filters repeat above the Nyquist rate—they first fold about the Nyquist frequency up to the sample rate of the system, after which the filter image repeats over and over again. This means that a boost at a frequency at 2 GHz in a system sampling at 8 GS/s, for example, will also boost frequencies at 6 GHz. Typically, only noise is present at this frequency, but the boosting of this noise in conjunction with the obliteration of all other noise might cause artifacts which are objectionable.

1.5 The Placement of $F_{hs}$.

Equation 8 makes reference to a frequency in the design specification called $F_{hs}$. Note in FIG. 7, that the placement of this frequency has an effect on the performance of the filter between $F_{hs}$ and $F_{sbs}$. The performance of the filter in this range of frequencies is unconstrained, and this lack of constraint is utilized in the design by allowing a dip in the gain of the system during this region. In other words, $F_{hs}$ must be placed at a frequency such that in between this frequency, and the start of the boost ramp region, this slight attenuation can be tolerated. As shown in FIG. 9, a slight bite has been taken out of the un-boosted response around 1.7 GHz. Over-constraining the system by pushing $F_{hs}$ up close to $F_{sbs}$, effectively enforcing a sharper edge, will generate a system that has higher Q values which is usually undesirable.

1.6 The Compromise Between Noise Performance and Pulse-response.

In this design in accordance with the invention, there are particular frequency response specifications that have significant implications with regard to the time-domain performance and to the noise reduction. Out to the boost ramp region, any smoothening of the system roll-off will improve the pulse response and reduce overshoot while simultaneously reducing noise. Beyond this point, a trade-off must be made regarding noise and pulse-response. Since the purpose of this invention is the boosting of the bandwidth of the system, the implication is that the system frequency response is rolling off around the boost point, and the roll-off rate is generally increasing. In situations like this, the pulse response will only be worsened unless the filter prior to the boost point has already applied some attenuation. In any case, the roll-off rate of the system can be controlled to some extent.

It has already been noted that the stabilizing zero does not allow the system to reach it's full potential with regard to noise performance. This zero does, however, provide the benefit of controlling the roll-off in the boost drop region. This is a good thing with regard to pulse response. It can be shown that with proper selection of the frequency and response for the frequencies $F_{pbe}$ and $F_{sbe}$, and the attenuation at $F_e$, the trade-off between system roll-off (and thus pulse-response performance) and noise attenuation outside of the pass-band can be made. The placement of these frequencies and their responses must be made with care, however, in order to maintain the ability to fit the analog filter to the design criteria and to provide an analog filter which is realizable as a digital filter with the given sample rate constraints.

Figure 10:
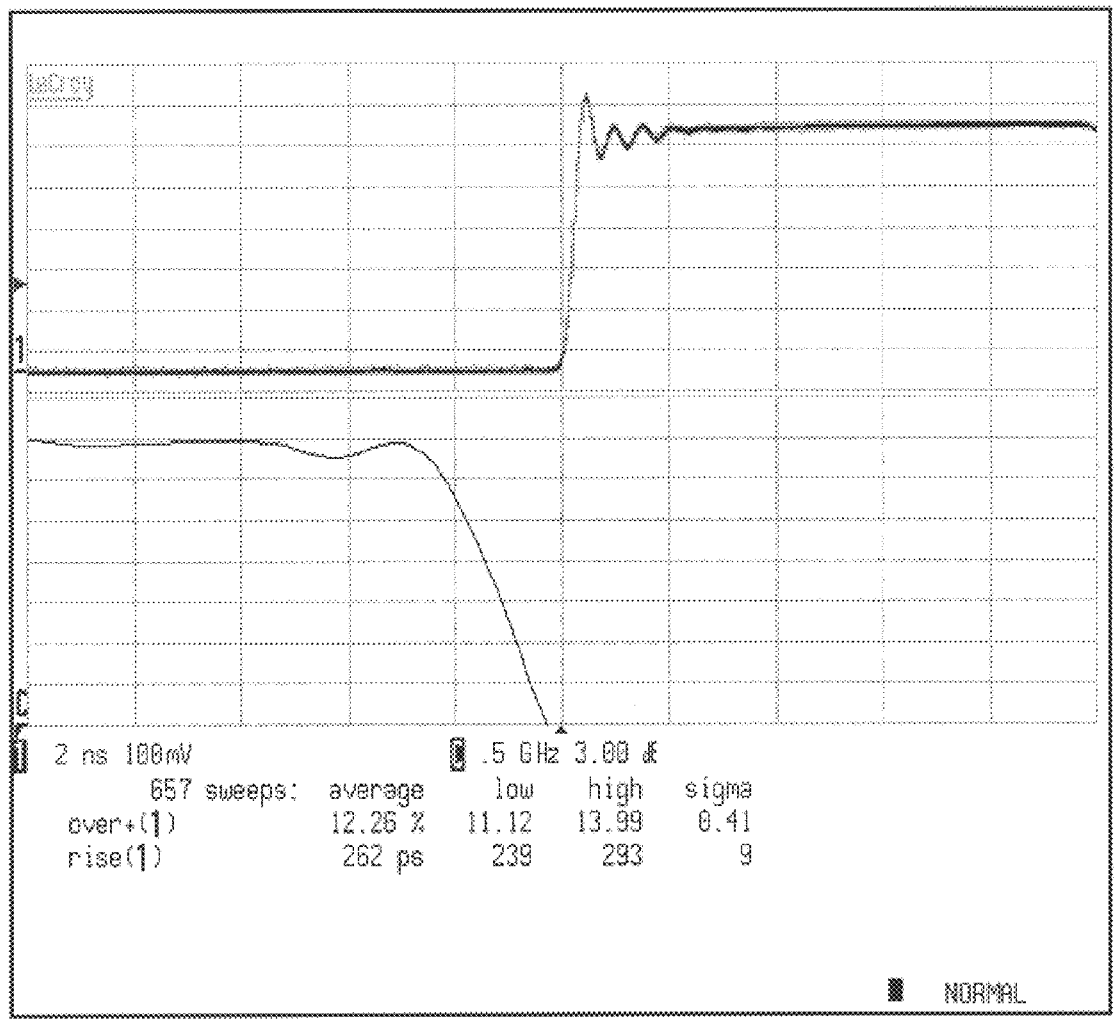
FIG. 10 shows a step response of an actual digital sampling oscilloscope without the boost filter in accordance with the invention applied along with the frequency response.
Figure 11:
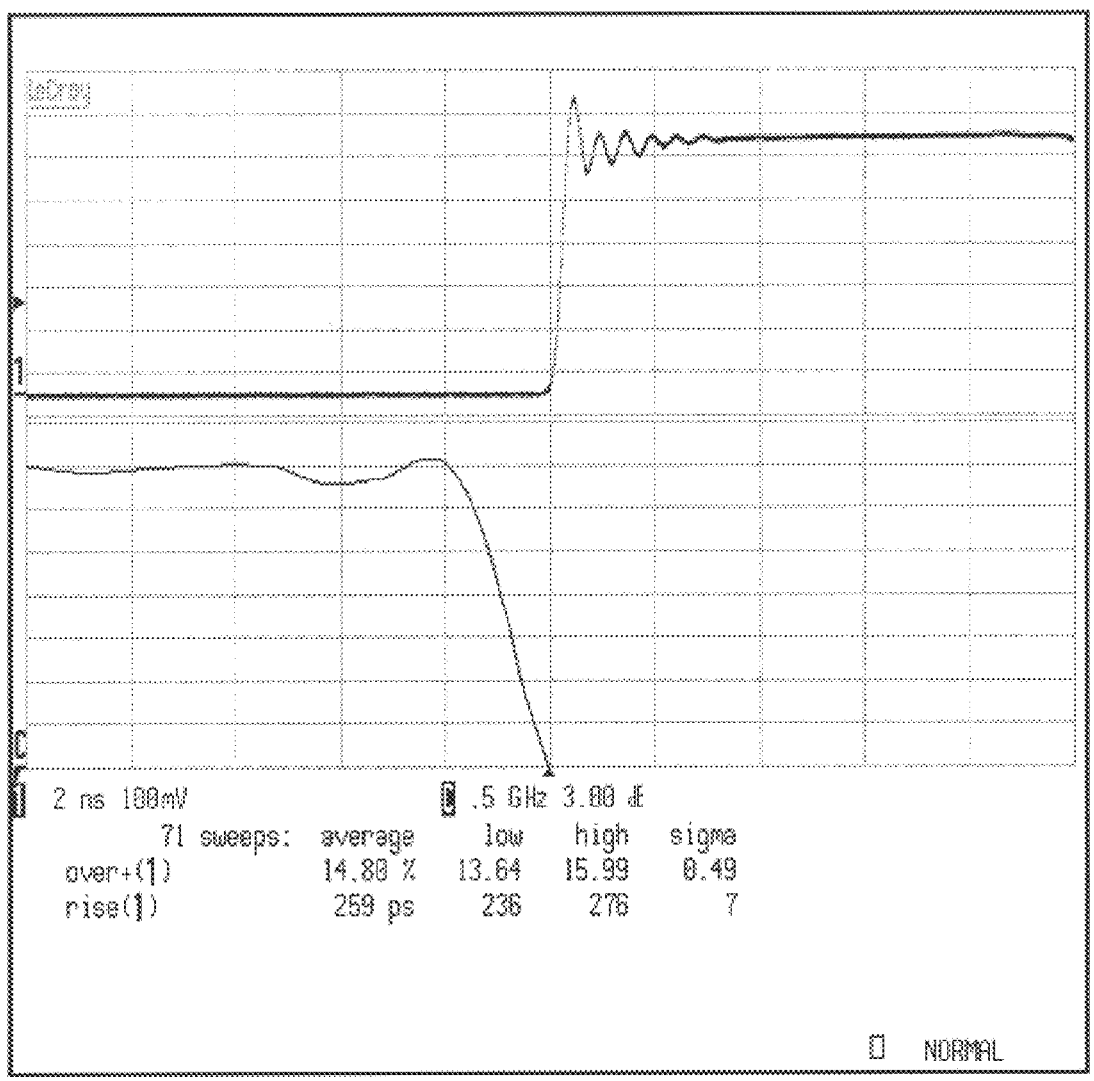
FIG. 11 shows the step response of the same actual digital sampling oscilloscope of FIG. 10 with the boost filter in accordance with the invention applied, depicting an improved frequency response.

In FIG. 9, it can be seen that the roll-off was not completely controlled, but the lack of discussion of this point simplified the explanation of the invention. This lack of control of the roll-off resulted in less than optimal noise attenuation performance and slight worsening of the pulse response as can be seen by comparing FIG. 10 and FIG. 11. Furthermore, the present invention is being applied to a system that requires 3 dB margin at the bandwidth specified in order to meet the bandwidth specification over the temperature range of the oscilloscope.

1.7 The Inverse Response Specification

The filter design specification as shown in FIG. 3 is very easy to understand conceptually and provides a rather generic filter spec. It is possible to tailor the specification to a particular unit's frequency response by substituting the negative of the frequency response for the unit for the response provided in Equation 9. This would enable virtually complete flattening/control of the frequency response. In order to do this, however, there needs to be a complete understanding of the response with regard to the filter order required to flatten the response. In general, the more bumps in the frequency response, the more poles and zeros (and thus a higher order) is required for the boost filter. The ability of the boost filter to flatten the response by specifying the inverse system response is implicit to the present invention.

Biquad Section Possibilities

In the implementation of any high order filter, it is sometimes useful to separate the filter into sections, effectively cascading sections of lower order. Usually the sections are second order biquad sections. This was not deemed necessary for this design in accordance with the invention. The method of separating this filter into multiple, lower order, cascaded sections is well known by those practiced in the art of digital signal processing.

It will thus be seen that the objects set forth above, among those made apparent from the preceding description, are efficiently attained and, because certain changes may be made in carrying out the above method and in the construction(s) set forth without departing from the spirit and scope of the invention, it is intended that all matter contained in the above description and shown in the accompanying drawings shall be interpreted as illustrative and not in a limiting sense.

It is also to be understood that the following claims are intended to cover all of the generic and specific features of the invention herein described and all statements of the scope of the invention which, as a matter of language, might be said to fall therebetween.

What is claimed:

1. A digital filter for increasing the bandwidth of a sampled system, comprising:
   a first response portion providing no adjustment to a signal of the sampled system;
   a second response portion providing a gain rising substantially log-linearly to said signal of the sampled system;
   a third response portion providing a substantially steady gain to said signal of the sampled system;
   a fourth response portion providing a gain dropping substantially log-linearly to said signal of the sampled signal; and
   a fifth response portion providing predetermined attenuation to said signal of said sampled system.

2. The digital filter of claim 1, wherein said bandwidth of said sampled system is increased to approximately 2 GHz.

3. The digital filter of claim 1, wherein said first response portion extends substantially from 0 to 1.8 GHz.

4. The digital filter of claim 1, wherein said second response portion extends from approximately 1.8 GHz to 2.0 GHz.

5. The digital filter of claim 1, wherein said fifth response portion extends substantially above 3 GHz.

6. The digital filter of claim 5, wherein said predetermined attenuation of said fifth response portion is −5 dB.

7. The digital filter of claim 1, wherein said third and fourth response portions are unspecified.

8. A digital filter for increasing the bandwidth of a sampled system, comprising:

a first response portion providing no adjustment to a signal of the sampled system;

a second response portion providing a gain rising substantially log-linearly to said signal of the sampled system; and a third response portion providing a predetermined attenuation to said signal of said sampled system.

9. The digital filter of claim 8, wherein said digital filter further flattens the frequency response of said sampled system.

10. The digital filter of claim 8, wherein said digital filter further reduces out-of-band noise.

11. The digital filter of claim 8, wherein said digital filter controls a pulse/step response of the sampled system.

12. The digital filter of claim 11, comprising multiple poles and zeros.

13. The digital filter of claim 11, wherein the magnitude in the second response portion is specified as the inverse frequency response of the original system being boosted.

14. The digital filter of claim 8, wherein the digital difference equation is implemented as biquad sections or any other filter topology.

15. The digital filter of claim 8, wherein said digital filter is represented as a Finite Impulse Response (FIR) filter, either by sampling the impulse response, or any other similar method.

16. A digital filter for use with a digital sampling oscilloscope, comprising:

a first response portion providing no adjustment to a signal of the sampled system;

a second response portion providing a gain rising substantially log-linearly to said signal of the sampled system; and a third response portion providing a predetermined attenuation to said signal of said sampled system.

17. The digital filter of claim 16, wherein said digital filter is implemented in hardware realizations including FPGAs, Gate Arrays and IP Cores.

18. The digital filter of claim 16, wherein a stabilizing zero is removed.

* * * * *